(12) United States Patent
Wu et al.

(10) Patent No.: US 11,711,980 B2
(45) Date of Patent: Jul. 25, 2023

(54) FLUID ACTUATOR

(71) Applicant: KOGE MICRO TECH CO., LTD., New Taipei (TW)

(72) Inventors: Chung-Han Wu, New Taipei (TW); Hsin-Cheng Wang, New Taipei (TW)

(73) Assignee: KOGE MICRO TECH CO., LTD., New Taipei (TW)

( * ) Notice: Subject to any disclaimer, the term of this patent is extended or adjusted under 35 U.S.C. 154(b) by 380 days.

(21) Appl. No.: 17/088,813

(22) Filed: Nov. 4, 2020

(65) Prior Publication Data

US 2021/0280769 A1 Sep. 9, 2021

(30) Foreign Application Priority Data

Nov. 4, 2019 (CN) .......................... 201911066417.7

(51) Int. Cl.
*H01L 41/047* (2006.01)
*H10N 30/20* (2023.01)
*F04B 43/04* (2006.01)
*H10N 30/88* (2023.01)
*H10N 30/87* (2023.01)

(52) U.S. Cl.
CPC ....... *H10N 30/2047* (2023.02); *F04B 43/046* (2013.01); *H10N 30/875* (2023.02); *H10N 30/88* (2023.02)

(58) Field of Classification Search
CPC ............. H01L 41/0973; H01L 41/0475; H01L 41/053; F04B 43/046
USPC .................................................. 310/324, 330
See application file for complete search history.

(56) References Cited

U.S. PATENT DOCUMENTS

2008/0218031 A1* 9/2008 Kuroda .................. H04R 17/10
310/334
2019/0143690 A1* 5/2019 Fujioka .................. H01L 24/73
347/71

* cited by examiner

*Primary Examiner* — Derek J Rosenau
(74) *Attorney, Agent, or Firm* — Juan Carlos A. Marquez; Marquez IP Law Office, PLLC (57) ABSTRACT

A fluid actuator includes an actuating portion, a piezoelectric unit, a conduction unit, and a levelness regulating portion. The actuating portion includes a first actuating area, a second actuating area, and at least one connecting section between the two actuating areas. The piezoelectric unit includes a first signal area and a second signal area. The two signal areas are provided in the same plane and are isolated from each other by an isolating portion. The piezoelectric unit corresponds in position to the first actuating area of the actuating portion. The conduction unit includes a first electrode and a second electrode. The first signal area of the piezoelectric unit is electrically connected to the first electrode, and the second signal area of the piezoelectric unit to the second electrode. The levelness regulating portion, the piezoelectric unit, and the conduction unit are located on the same side of the actuating portion.

9 Claims, 7 Drawing Sheets

FLUID ACTUATOR

BACKGROUND OF THE INVENTION

1. Technical Field

The present invention relates to an actuator and more particularly to an actuator in which a levelness regulating portion is designed to render the entire structure of the actuator uniformly level.

2. Description of Related Art

Piezoelectric pumps are a new type of fluid driving devices. They do not require an additional electrical driving mechanism but work on the inverse piezoelectric effect of piezoelectric ceramic instead. More specifically, a piezoelectric vibrator is deformed due to the inverse piezoelectric effect, and the deformation causes a change in volume of the pump chamber such that the fluid in the pump chamber is output. Or, the piezoelectric vibrator is vibrated in order to transfer a fluid. Piezoelectric pumps have gradually replaced the conventional pumps and are now in extensive use in the electronics, biomedical, aerospace, automobile, and petrochemical industries.

Generally speaking, a piezoelectric pump is composed of a piezoelectric unit and a pump body. When supplied with electricity, the piezoelectric unit undergoes radial contraction under the action of an electric field, generates an internal tensile stress accordingly, and is deformed, or curved, as a result. When the piezoelectric unit is curved forward, the chamber of the pump body (hereinafter referred to as the pump chamber) is increased in volume, so the pressure in the pump chamber is lowered, allowing a fluid to flow into the pump chamber through the inlet of the pump chamber. When the piezoelectric unit is curved backward, the volume of the pump chamber is reduced such that the pressure in the pump chamber rises. The fluid in the pump chamber is thus pushed out through the outlet of the pump chamber. Nowadays, the signal transmission layer used to supply electricity to the piezoelectric unit is typically a three-dimensional structure and is additionally provided on the exterior of the pump body, resulting in a relatively large pump structure that is prone to damage. If the signal transmission layer is secured in place by a welding process in which positive and negative electrodes are used separately, the welding points may have inconsistent reliability, which compromises the quality and performance of the piezoelectric pump. Moreover, the protruding welding points on the exterior of the pump body are likely to contact a nearby external object such that the pump body malfunctions and makes strange noises.

BRIEF SUMMARY OF THE INVENTION

The present invention provides an actuator in which a levelness regulating portion is provided between a supporting portion, a piezoelectric unit, and a conduction unit, and in which the planar electrical connection in the pump body allows the exterior of the entire structure of the actuator to be uniformly level. Not only does the foregoing configuration solve the problem of low reliability associated with the aforesaid welding process, but also the internal planar electrical connection technique provides the actuator with a level external surface and enables miniaturization of the actuator.

The present invention provides an actuator that includes an actuating portion, a piezoelectric unit, a conduction unit, and a levelness regulating portion. The actuating portion has a first actuating area, a second actuating area, and at least one connecting section between the first actuating area and the second actuating area. The piezoelectric unit has a first signal area and a second signal area. The first signal area and the second signal area are provided in the same plane, with an isolating portion provided between the first signal area and the second signal area. The piezoelectric unit is provided at a position corresponding to the first actuating area of the actuating portion. The conduction unit includes a first electrode and a second electrode. The first signal area of the piezoelectric unit is electrically connected to the first electrode of the conduction unit, and the second signal area of the piezoelectric unit is electrically connected to the second electrode of the conduction unit. The levelness regulating portion, the piezoelectric unit, and the conduction unit are located on the same side of the actuating portion.

In one embodiment of the present invention, the actuator further includes a supporting portion. The supporting portion and the piezoelectric unit are located in the same plane, and the supporting portion and the piezoelectric unit are located on the same side of the actuating portion. The supporting portion is provided at a position corresponding to the second actuating area of the actuating portion.

In the first embodiment of the present invention, the conduction unit further includes an insulating layer, a conducting portion, and a substrate. The conduction unit is formed by stacking the insulating layer, the conducting portion, and the substrate together.

In the first embodiment of the present invention, the levelness regulating portion is electrically conductive.

In the first embodiment of the present invention, the levelness regulating portion is configured to control the levelness of the entire structure of the actuator.

In the first embodiment of the present invention, the substrate has a level surface thanks to the levelness regulating portion compensating for differences in levelness.

In the first embodiment of the present invention, the piezoelectric unit, the conduction unit, the levelness regulating portion, and the supporting portion are located on the same side of the actuating portion.

In the first embodiment of the present invention, the first electrode and the second electrode are located in the same plane.

In the second and the fourth embodiments of the present invention, the actuator further includes a hole penetrating plate, and the hole penetrating plate is provided at a position corresponding to the first actuating area of the actuating portion.

In the second and the fourth embodiments of the present invention, the piezoelectric unit includes a first passageway, and the hole penetrating plate extends through the first passageway.

In the second and the fourth embodiments of the present invention, the conduction unit includes a second passageway corresponding to the hole penetrating plate, and the hole penetrating plate extends through the second passageway and is fixed to the first actuating area of the actuating portion.

According to the above, the actuator of the present invention is so designed that the piezoelectric unit, the conduction unit, and the levelness regulating portion are provided on the same side of the actuating portion to reduce the height of the entire structure of the actuator, and that the levelness regulating portion controls the structural levelness of each component of the actuator and thereby allows the substrate to have a level surface, which helps enhance and stabilize the performance of the actuator.

BRIEF DESCRIPTION OF THE SEVERAL VIEWS OF THE DRAWINGS

To make the foregoing features and advantages of the present invention readily understandable, some embodiments are detailed below with reference to the accompanying drawings, in which.

DETAILED DESCRIPTION OF THE INVENTION

Figure 1:
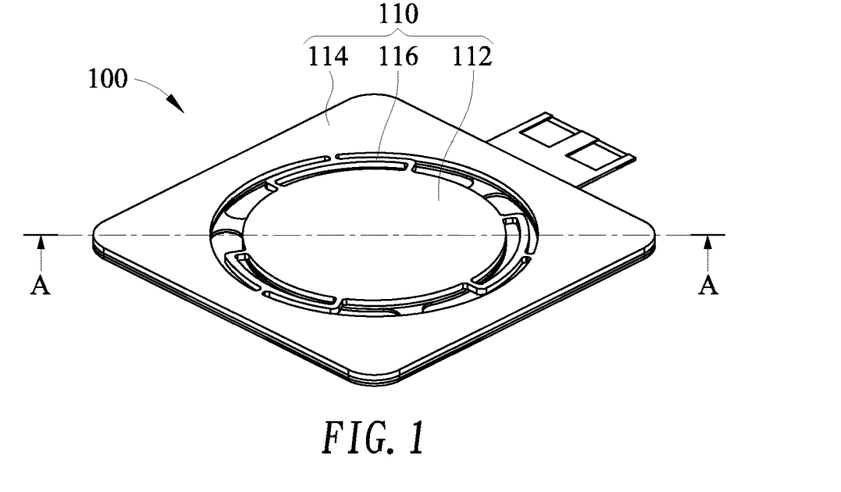
FIG. 1 is an assembled perspective view of the actuator according to the first embodiment of the present invention.
Figure 2:
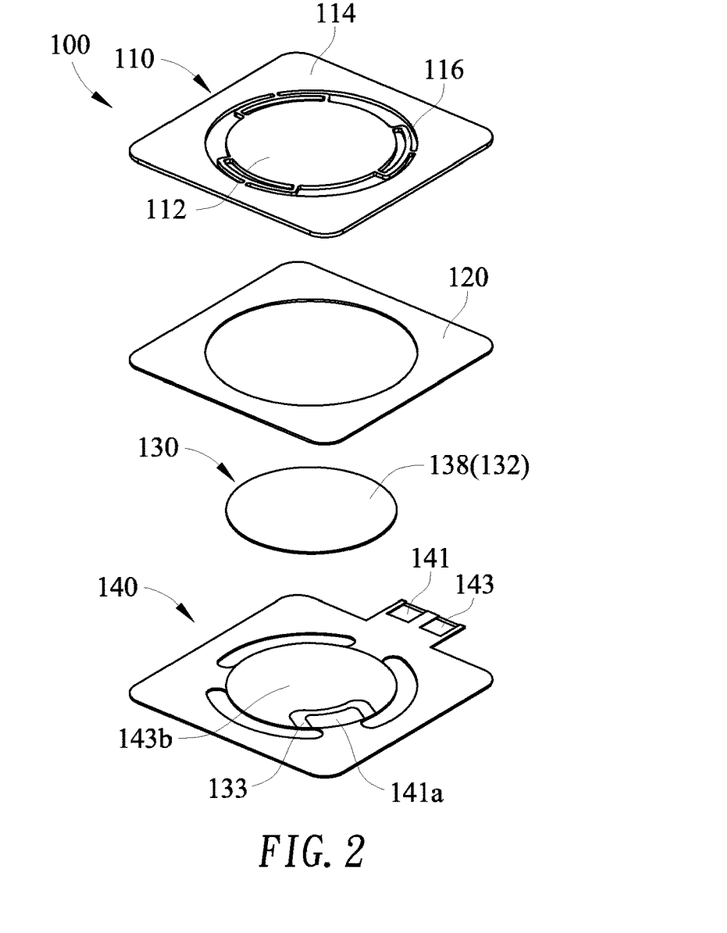
FIG. 2 is an exploded perspective view of the actuator in FIG. 1.
Figure 3:
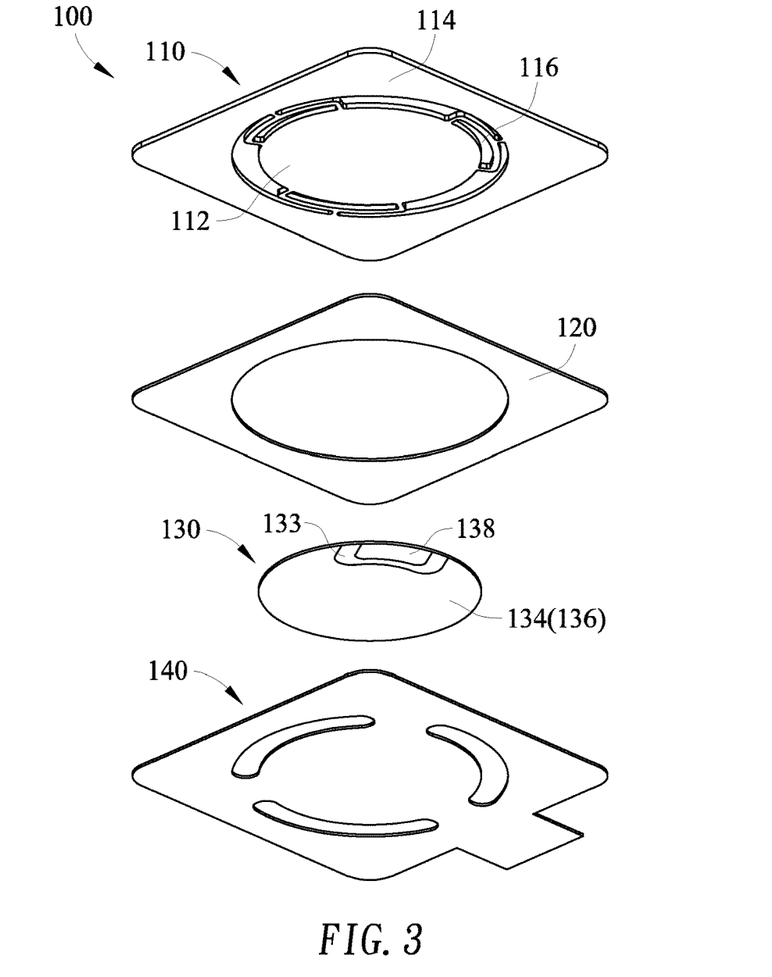
FIG. 3 is another exploded perspective view of the actuator in FIG. 1.
Figure 4:
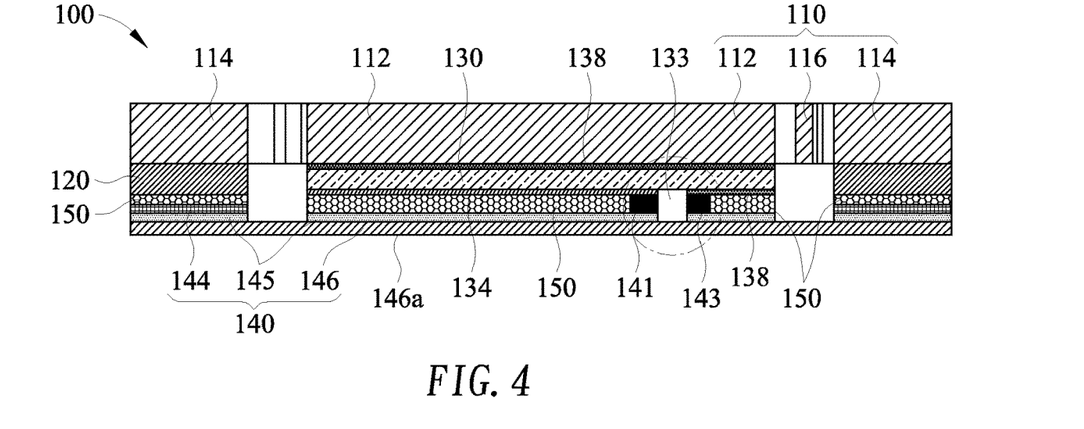
FIG. 4 is a sectional view taken along line A-A in FIG. 1.
Figure 5:
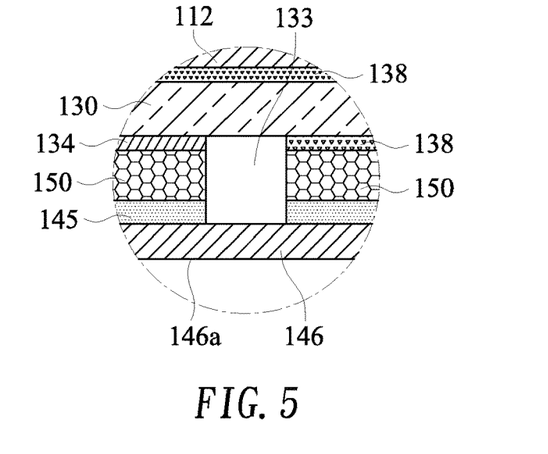
FIG. 5 is a partial enlarged view of FIG. 4.

FIG. 1 is an assembled perspective view of the actuator according to the first embodiment of the present invention. FIG. 2 is an exploded perspective view of the actuator in FIG. 1. FIG. 3 is another exploded perspective view of the actuator in FIG. 1. FIG. 4 is a sectional view taken along line A-A in FIG. 1. FIG. 5 is a partial enlarged view of FIG. 4. As shown in FIG. 1 to FIG. 5, the actuator 100 according to the first embodiment includes an actuating portion 110, a piezoelectric unit 130, a supporting portion 120, a levelness regulating portion 150, and a conduction unit 140. The following paragraphs provide a detailed description of the actuator 100.

Referring to FIG. 2, the actuating portion 110 in this embodiment includes a first actuating area 112, a second actuating area 114, and at least one connecting section 116 between the first actuating area 112 and the second actuating area 114. The first actuating area 112 can be moved with respect to the second actuating area 114.

Referring to FIG. 2 to FIG. 4, the piezoelectric unit 130 in this embodiment is provided at a position corresponding to the first actuating area 112 of the actuating portion 110. The piezoelectric unit 130 has a first side 132 and a second side 136 (see FIG. 3) that correspond to each other. The piezoelectric unit 130 further has a first signal area 134 and a second signal area 138, both provided on the second side 136; in other words, the first signal area 134 and the second signal area 138 are located in the same plane of the second side 136. The first signal area 134 and the second signal area 138 are electrically isolated from each other by an isolating portion 133 that is provided between the two signal areas. The second signal area 138 has a conduction region that extends to the first side 132 (see FIG. 2). The shapes of the first signal area 134 and of the second signal area 138 are not limited to those disclosed in this embodiment.

Referring to FIG. 2 and FIG. 3, the conduction unit 140 in this embodiment includes a first electrode 141 and a second electrode 143. The first electrode 141 and the second electrode 143 are located in the same plane and are electrically insulated from each other. The first signal area 134 of the piezoelectric unit 130 is electrically connected to the first electrode 141 of the conduction unit 140, and the second signal area 138 of the piezoelectric unit 130 is electrically connected to the second electrode 143 of the conduction unit 140.

Referring to FIG. 2 and FIG. 3, the actuator 100 according to this embodiment includes the supporting portion 120, which is located in the same plane as the piezoelectric unit 130. The supporting portion 120, the piezoelectric unit 130, and the conduction unit 140 are all located on the same side of the actuating portion 110. The supporting portion 120 is provided at a position corresponding to the second actuating area 114 of the actuating portion 110.

Referring to FIG. 4, the actuator 100 according to this embodiment includes the levelness regulating portion 150, and all of the levelness regulating portion 150, the piezoelectric unit 130, and the conduction unit 140 are located on the same side of the actuating portion 110. The levelness regulating portion 150 is composed of an electrically conductive material such as an electrical conductor, an electrically conductive adhesive, an electrically conductive powder, an electrically conductive elastomer, or an electrically conductive anisotropic material. By controlling the thickness of the levelness regulating portion 150, outstanding levelness of the entire structure of the actuator 100 can be achieved. The levelness regulating portion 150 is shaped according to the space formed between the piezoelectric unit 130, the supporting portion 120, and the conduction unit 140. The shape of the levelness regulating portion 150 is not limited to that disclosed in this embodiment.

Referring to FIG. 4, the conduction unit 140 in this embodiment further includes an insulating layer 144, a conducting portion 145, and a substrate 146. The conducting portion 145 includes the first electrode 141 and the second electrode 143. The first electrode 141 and the second electrode 143 in this embodiment are located in the same plane but are not necessarily so. By adjusting the thickness of the levelness regulating portion 150, the thickness and levelness of the entire conduction unit 140 can be rendered uniform. The thickness of the insulating layer 144 is less than or equal to ($\leq$) 1 mm. By adjusting the thickness of the levelness regulating portion 150, the substrate 146 is allowed to have a level surface 146a.

Please refer to FIG. 5, which is an enlarged view of the circled area in FIG. 4. The conduction unit 140 in this embodiment is composed of the insulating layer 144, the conducting portion 145, and the substrate 146. With the levelness regulating portion 150 making levelness adjustment for each component of the actuator 100, i.e., compensating for the differences in levelness of and between the components of the actuator 100, the entire structure of the actuator 100 is made uniformly level. The insulating layer 144 isolates, and thereby electrically insulates, the conducting portion 145 from the supporting portion 120. The substrate 146 is located on the bottom side of the conduction unit 140 and, thanks to the levelness regulating portion 150, forms the level surface 146a, which allows the assembled conduction unit 140 to be connected to other components of the actuator 100 in a level manner.

Referring to FIG. 2 and FIG. 3, the conduction unit 140 in this embodiment is provided as the bottom-most layer. When the conduction unit 140 is supplied with electricity, electrical signals are conducted to, and thus input into, the first electrode 141 and the second electrode 143 separately, wherein the first electrode 141 is in conduction with a first conduction area 141a, and the second electrode 143 with a second conduction area 143b. According to the concept of the present invention, the order in which the supporting portion 120, the piezoelectric unit 130, the levelness regulating portion 150, and the conduction unit 140 are arranged may vary as needed (i.e., their structural arrangement is not limited to that disclosed in this embodiment), provided that the first signal area 134 of the piezoelectric unit 130 is electrically connected to the first electrode 141 of the conduction unit 140, and the second signal area 138 to the second electrode 143. For example, the first electrode 141 forms the first conduction area 141a at a position adjacent to the center of the conduction unit 140 so that the first signal area 134 of the piezoelectric unit 130 can be electrically connected to the first electrode 141 of the conduction unit 140 through the first conduction area 141a. In this embodiment, the second electrode 143 forms the second conduction area 143b at the center of the conduction unit 140 so that the second signal area 138 of the piezoelectric unit 130 can be electrically connected to the second electrode 143 of the conduction unit 140 through the second conduction area 143b. The pattern or shape of each of the two conduction areas may vary as appropriate; for example, each conduction area may be shaped as an elongated strip, a circular arc, a triangle, or other polygons. The shape and number of each of the first conduction area 141a and the second conduction area 143b are not limited to those disclosed in this embodiment. More specifically, the shape and number of each of the first conduction area 141a and the second conduction area 143b may vary according to practical needs, provided that the conduction areas can electrically connect the first signal area 134 to the first electrode 141 and the second signal area 138 to the second electrode 143.

Figure 6:
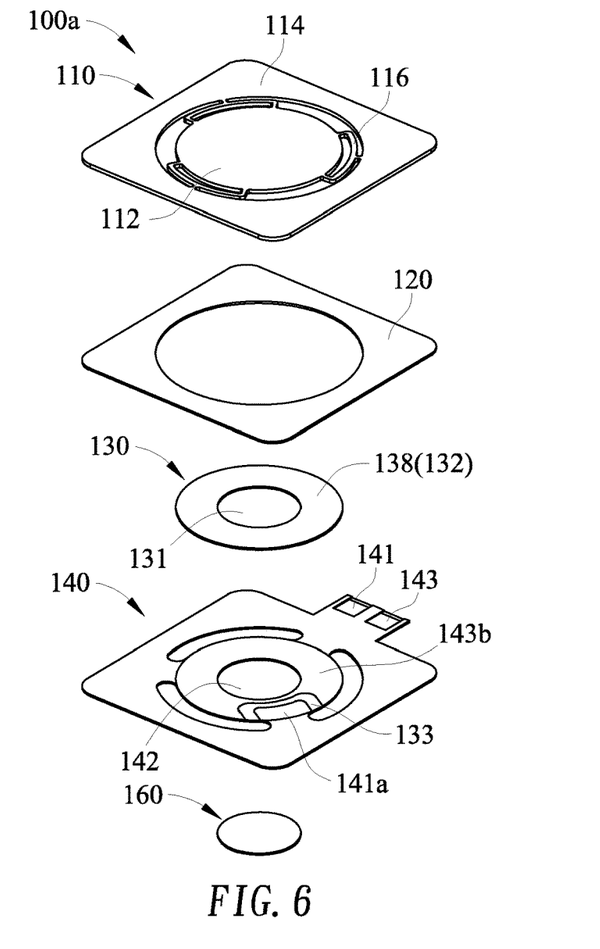
FIG. 6 is an exploded perspective view of the actuator according to the second embodiment of the invention.
Figure 7:
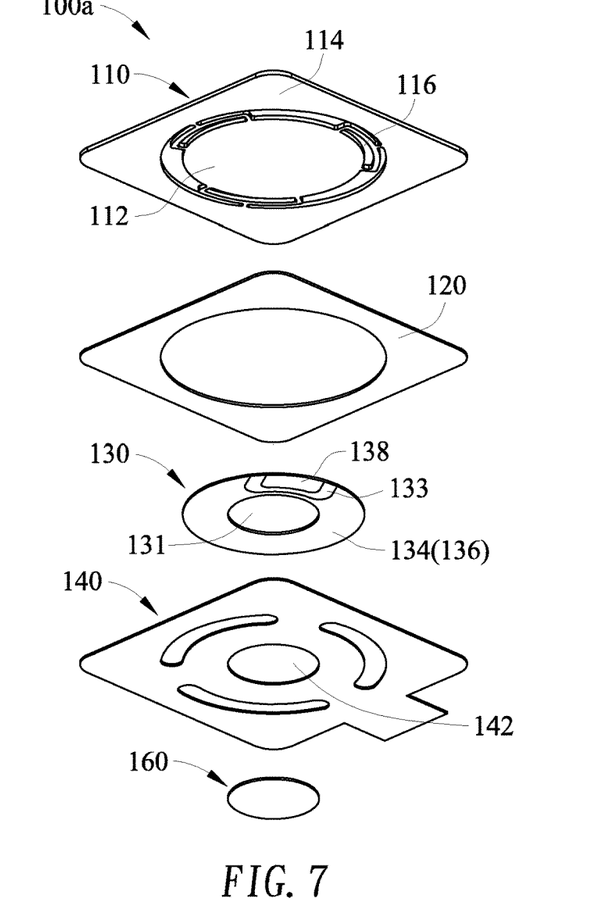
FIG. 7 is another exploded perspective view of the actuator in FIG. 6.
Figure 8:
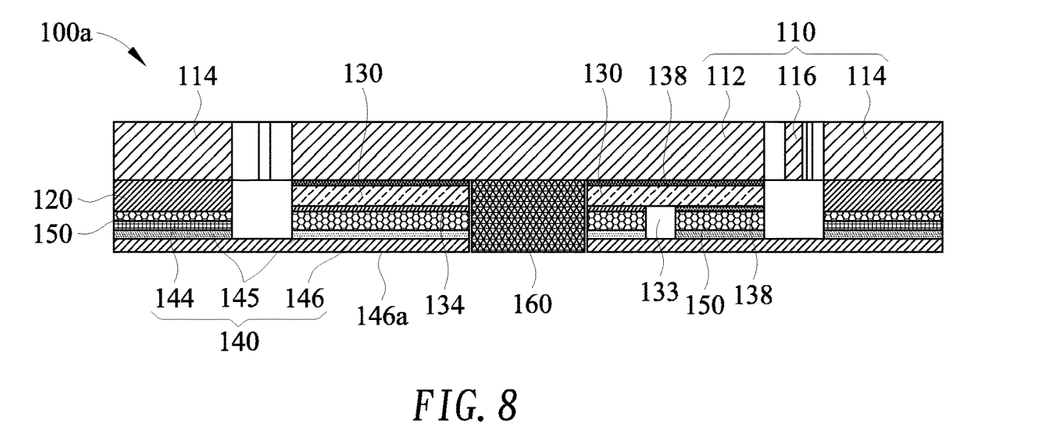
FIG. 8 is a sectional view of the actuator in FIG. 6.

The following paragraphs describe an actuator of a different configuration, namely the actuator 100a according to the second embodiment of the present invention. In this embodiment, elements that are the same as or similar to their counterparts in the first embodiment are identified with the same or similar reference numerals, and these elements will not be described repeatedly; only the main differences between the first and the second embodiments will be dealt with below. FIG. 6 is an exploded perspective view of the actuator according to the second embodiment of the invention. FIG. 7 is another exploded perspective view of the actuator in FIG. 6. FIG. 8 is a sectional view of the actuator in FIG. 6. Referring to FIG. 8 in conjunction with FIG. 4, the actuator 100a of the second embodiment is different from the actuator 100 of the first embodiment mainly in that the actuator 100a further includes a hole penetrating plate 160.

In the second embodiment, referring to FIG. 6 to FIG. 8, the hole penetrating plate 160 is provided at a position corresponding to the center of the first actuating area 112 of the actuating portion 110, and the piezoelectric unit 130 further includes a first passageway 131, which does not exist in the first embodiment. The first passageway 131 renders the piezoelectric unit 130 into a hollow plate, and the hole penetrating plate 160 extends through the first passageway 131. The conduction unit 140 also includes a second passageway 142 that corresponds to the hole penetrating plate 160. The hole penetrating plate 160 extends through the second passageway 142 too and is fixed to the first actuating area 112 of the actuating portion 110. To assemble the actuator 110a, the hole penetrating plate 160 is passed sequentially through the second passageway 142 and the first passageway 131 and then fixed to the first actuating area 112 of the actuating portion 110. In this embodiment, the hole penetrating plate 160 may be made of, for example but not limited to, metal, ceramic, or plastic.

Referring to FIG. 6 and FIG. 7, the piezoelectric unit 130 in this embodiment is in the form of a hollow annular plate so that the hole penetrating plate 160 can be mounted securely in the first passageway 131 at the center of, and be surrounded and fixed in position by, the piezoelectric unit 130. The shape and number of each of the piezoelectric unit 130 and the hole penetrating plate 160, however, are not limited to those disclosed in this embodiment, and the arrangement between the piezoelectric unit 130 and the hole penetrating plate 160 is not limited to that disclosed in this embodiment, either. The number and shape of the second passageway 142 of the conduction unit 140 may also vary according to the number and shape of the hole penetrating plate 160 and are not limited to those disclosed in this embodiment.

In this embodiment, referring to FIG. 8, the bottom side of the hole penetrating plate 160 is flush with the level surface 146a of the substrate 146. According to the concept of the present invention, the levelness regulating portion 150 makes levelness adjustment for the level surface 146a of the substrate 146 regardless of whether the bottom side of the hole penetrating plate 160 is flush with or protrudes beyond the level surface 146a of the substrate 146. Therefore, the bottom side of the hole penetrating plate 160 may be flush with or protrude beyond the level surface 146a of the substrate 146 as appropriate to the overall design of the actuator; the invention has no limitation in this regard.

According to the concept of the present invention, the arrangement between the actuating portion 110, the piezoelectric unit 130, the supporting portion 120, the levelness regulating portion 150, the conduction unit 140, and the hole penetrating plate 160 may vary but still allows the first signal area 134 to be electrically connected to the first electrode 141, and the second signal area 138 to the second electrode 143. Moreover, electrical conduction to the first signal area 134 and the second signal area 138 of the piezoelectric unit 130 will not be affected by the piezoelectric unit 130 being a solid or hollow plate structure.

Figure 9:
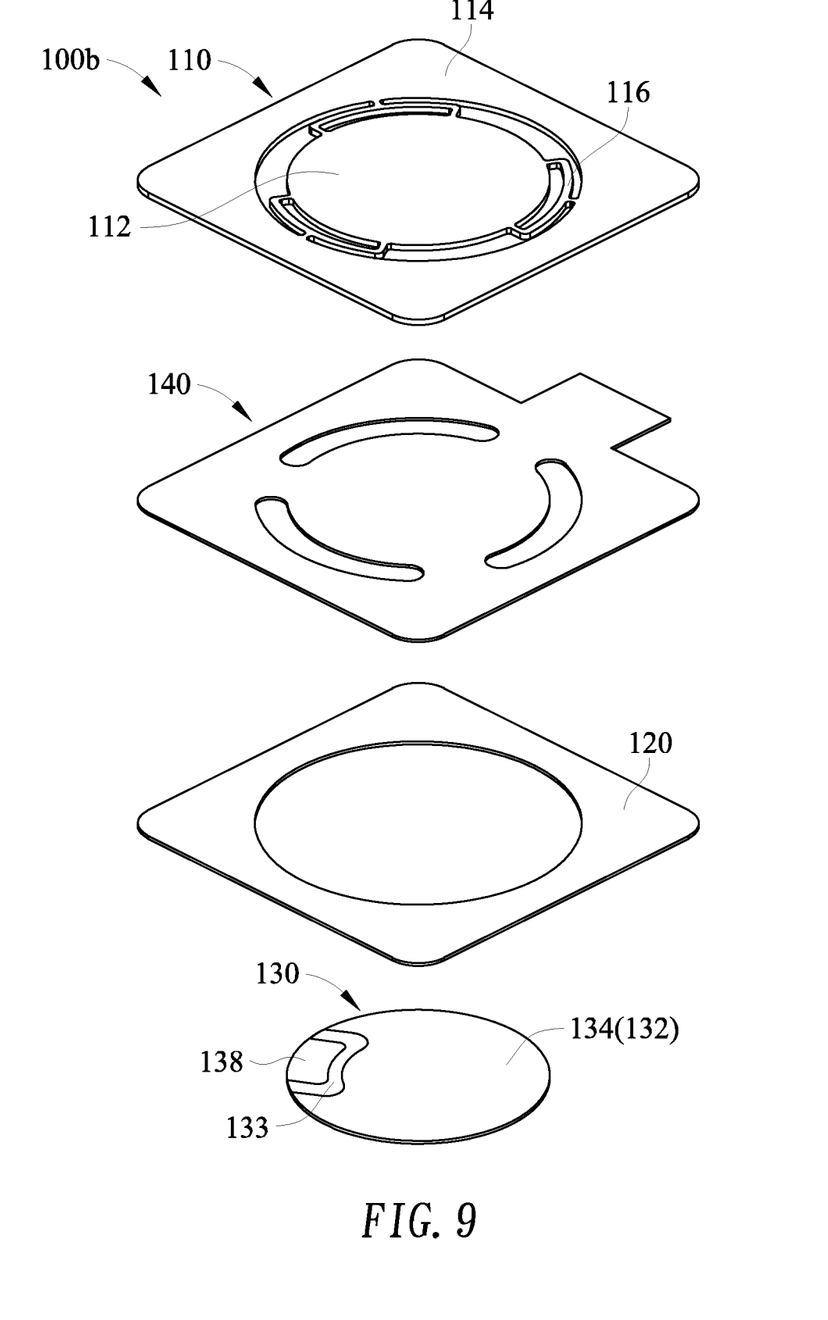
FIG. 9 is an exploded perspective view of the actuator according to the third embodiment of the invention.
Figure 10:
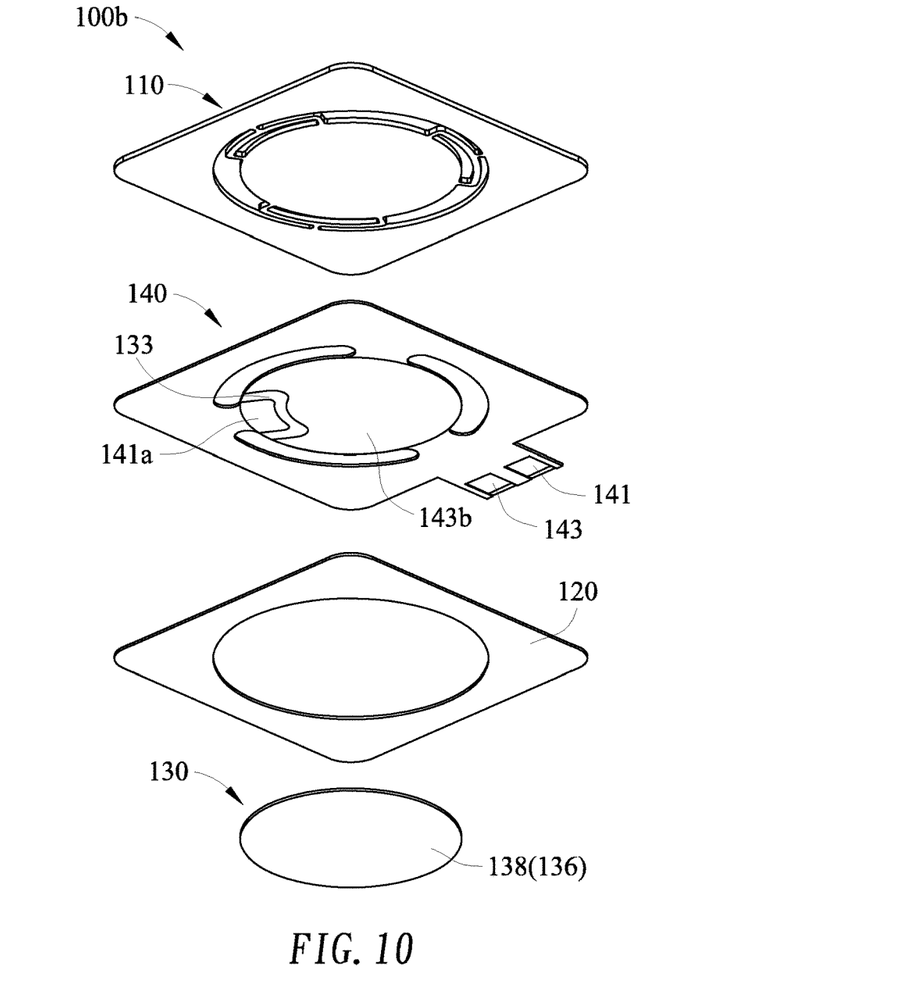
FIG. 10 is another exploded perspective view of the actuator in FIG. 9.
Figure 11:
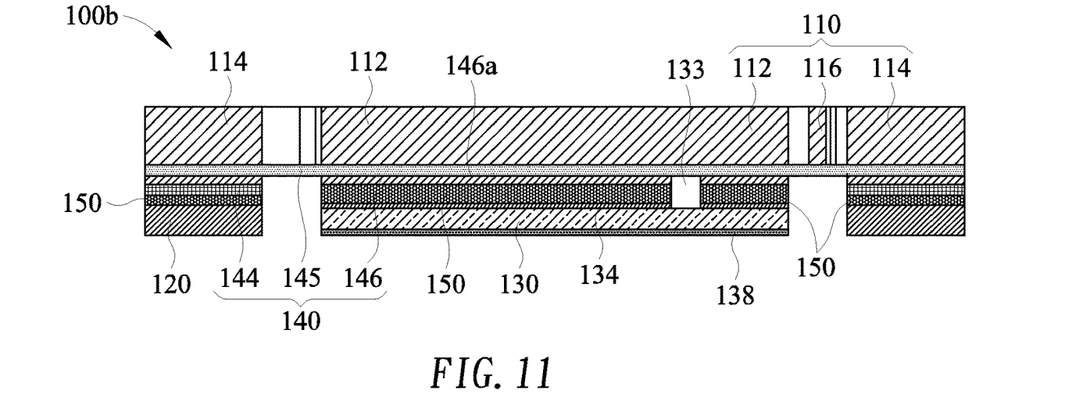
FIG. 11 is a sectional view of the actuator in FIG. 9.

The following paragraphs describe an actuator of yet another configuration, namely the actuator 100b according to the third embodiment of the present invention. In this embodiment, elements that are the same as or similar to their counterparts in the first embodiment are identified with the same or similar reference numerals, and these elements will not be described repeatedly; only the main differences between the first and the third embodiments will be dealt with below. FIG. 9 is an exploded perspective view of the actuator according to the third embodiment of the invention. FIG. 10 is another exploded perspective view of the actuator in FIG. 9. FIG. 11 is a sectional view of the actuator in FIG. 9. Referring to FIG. 11 in conjunction with FIG. 4, the actuator 100b of the third embodiment is different from the actuator 100 of the first embodiment mainly in that the conduction unit 140 is provided between the actuating portion 110 and the piezoelectric unit 130.

Referring to FIG. 10, the conduction unit 140 includes the first electrode 141 and the second electrode 143. The first electrode 141 and the second electrode 143 are located in the same plane and are electrically insulated from each other. In the third embodiment, referring to FIG. 9, the piezoelectric unit 130 is a solid plate structure, and the first signal area 134 and the second signal area 138 of the piezoelectric unit 130 are located in the same plane and are electrically isolated from each other by the isolating portion 133, which is provided between the two signal areas. The first signal area 134 of the piezoelectric unit 130 is electrically connected to the first electrode 141 of the conduction unit 140, and the second signal area 138 is electrically connected to the second electrode 143 of the conduction unit 140.

In this embodiment, referring to FIG. 11 in conjunction with FIG. 4, the insulating layer 144, the conducting portion 145, and the substrate 146 of the conduction unit 140 are stacked in the opposite direction of that in the first embodiment. More specifically, the conduction unit 140 in the third embodiment is so configured that the substrate 146, the conducting portion 145, and the insulating layer 144 are sequentially stacked downward. Also, referring to FIG. 9 and FIG. 10, the first signal area 134 and the second signal area 138 of the piezoelectric unit 130 in this embodiment area arranged in a reverse manner as compared with their counterparts in the first embodiment. More specifically, the first signal area 134 and the second signal area 138 in the third embodiment are located in the same plane of the first side 132 and are electrically isolated from each other by the isolating portion 133, with the conduction region of the second signal area 138 extending to the second side 136. According to the concept of the present invention, the piezoelectric unit 130 and the conduction unit 140 may swap positions without affecting the levelness adjustment made by the levelness regulating portion 150 for the entire structure of the actuator, or hindering the electrical connection between the first signal area 134 of the piezoelectric unit 130 and the first electrode 141 of the conduction unit 140 and between the second signal area 138 and the second electrode 143 of the conduction unit 140.

Figure 12:
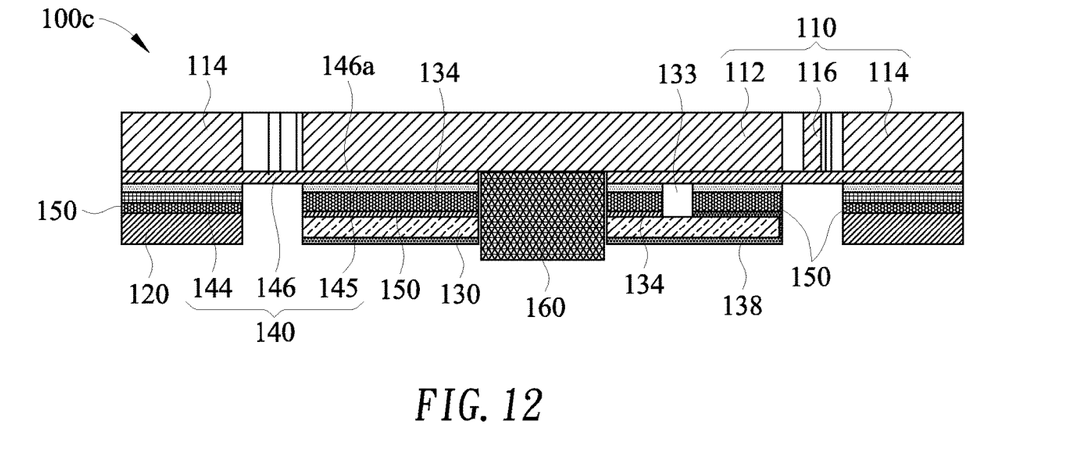
FIG. 12 is a sectional view of the actuator according to the fourth embodiment of the invention.

The following paragraphs describe an actuator of still another configuration, namely the actuator 100c according to the fourth embodiment of the present invention. In this embodiment, elements that are the same as or similar to their counterparts in the third embodiment are identified with the same or similar reference numerals, and these elements will not be described repeatedly; only the main differences between the third and the fourth embodiments will be dealt with below. FIG. 12 is a sectional view of the actuator according to the fourth embodiment of the invention. Referring to FIG. 12 in conjunction with FIG. 11, the actuator 100c of the fourth embodiment is different from the actuator 100b of the third embodiment mainly in that the actuator 100c further includes the hole penetrating plate 160, and that the piezoelectric unit 130 is a hollow plate structure.

Referring to FIG. 12, the conduction unit 140 is provided between the actuating portion 110 and the piezoelectric unit 130, the hole penetrating plate 160 is provided at a position corresponding to the center of the first actuating area 112 of the actuating portion 110, the piezoelectric unit 130 is provided with the first passageway 131 corresponding to the hole penetrating plate 160, the conduction unit 140 is also provided with the second passageway 142 corresponding to the hole penetrating plate 160, and the levelness regulating portion 150 is formed in the space between the piezoelectric unit 130, the supporting portion 120, and the conduction unit 140, in adaptation to the position of the hole penetrating plate 160. To assemble the actuator 100c, the hole penetrating plate 160 is passed sequentially through the first passageway 131 and the second passageway 142 and then fixed to the first actuating area 112 of the actuating portion 110.

Moreover, the bottom side of the hole penetrating plate 160 in this embodiment protrudes beyond the level surface of the second signal area 138 of the piezoelectric unit 130. According to the concept of the present invention, the bottom side of the hole penetrating plate 160 may be flush with or protrude beyond the level surface of the second signal area 138 of the piezoelectric unit 130 without affecting the levelness adjustment made by the levelness regulating portion 150 for the level surface 146a of the substrate 146. In other words, even if the bottom side of the hole penetrating plate 160 protrudes beyond the level surface of the second signal area 138 of the piezoelectric unit 130, levelness adjustment can be made for the actuator, and electrical connection between the first signal area 134 of the piezoelectric unit 130 and the first electrode 141 of the conduction unit 140 and between the second signal area 138 and the second electrode 143 of the conduction unit 140 can be established.

According to the concept of the present invention, electrical connection between the first signal area 134 and the first electrode 141 and between the second signal area 138 and the second electrode 143 can be made regardless of the positional arrangement between the actuating portion 110, the piezoelectric unit 130, the supporting portion 120, the levelness regulating portion 150, the conduction unit 140, and the hole penetrating plate 160. Moreover, the piezoelectric unit 130 may be a solid or hollow plate structure without affecting electrical conduction to the first signal area 134 and the second signal area 138 of the piezoelectric unit 130.

According to the above, the actuator of the present invention is so designed that the piezoelectric unit 130, the supporting portion 120, the levelness regulating portion 150, the conduction unit 140, and the hole penetrating plate 160 are provided on the same side of the actuating portion 110, and that the levelness regulating portion 150 controls the levelness of the entire structure of the actuator and allows the substrate 146 of the conduction unit 140 to have a level surface. Compared with the conventional multilayer actuator structures, the actuator disclosed herein not only has a smaller overall thickness that enables structure miniaturization, but also features higher levelness of the entire actuator structure and hence an effective increase in the driving efficiency of the actuator.

The above description is only the preferred embodiments of the present invention, and is not intended to limit the present invention in any form. Although the invention has been disclosed as above in the preferred embodiments, they are not intended to limit the invention. A person skilled in the relevant art will recognize that equivalent embodiment modified and varied as equivalent changes disclosed above can be used without parting from the scope of the technical solution of the present invention. All the simple modification, equivalent changes and modifications of the above embodiments according to the material contents of the invention shall be within the scope of the technical solution of the present invention.

What is claimed is:

1. A fluid actuator, comprising:
   an actuating portion having a first actuating area, a second actuating area, and at least one connecting section between the first actuating area and the second actuating area;
   a piezoelectric unit having a first signal area and a second signal area, wherein the first signal area and the second signal area are provided in a same plane, with an isolating portion provided between the first signal area and the second signal area, and the piezoelectric unit is provided at a position corresponding to the first actuating area of the actuating portion;

a conduction unit comprising a first electrode and a second electrode, wherein the first signal area of the piezoelectric unit is electrically connected to the first electrode of the conduction unit, and the second signal area of the piezoelectric unit is electrically connected to the second electrode of the conduction unit; and a levelness regulating portion, wherein the piezoelectric unit, the conduction unit, and the levelness regulating portion are located on a same side of the actuating portion;

wherein the first actuating area, the second actuating area, and the at least one connecting section are located in the same plane;

wherein the conduction unit comprises an insulating layer, a conducting portion, and a substrate, wherein the conduction unit is formed by stacking the insulating layer, the conducting portion, and the substrate together; and wherein the substrate has a level surface resulting from the levelness regulating portion compensating for differences in levelness.

2. The fluid actuator of claim 1, further comprising:

a supporting portion, wherein the supporting portion and the piezoelectric unit are located in a same plane, the piezoelectric unit and the supporting portion are located on the same side of the actuating portion, and the supporting portion is provided at a position corresponding to the second actuating area of the actuating portion.

3. The fluid actuator of claim 1, wherein the levelness regulating portion is electrically conductive.

4. The fluid actuator of claim 1, wherein the levelness regulating portion is configured to control levelness of an entire structure of the fluid actuator.

5. The fluid actuator of claim 2, wherein the piezoelectric unit, the conduction unit, the levelness regulating portion, and the supporting portion are located on the same side of the actuating portion.

6. The fluid actuator of claim 1, wherein the first electrode and the second electrode are located in a same plane.

7. The fluid actuator of claim 1, further comprising:

a hole penetrating plate provided at a position corresponding to the first actuating area of the actuating portion.

8. The fluid actuator of claim 7, wherein the piezoelectric unit comprises a first passageway, and the hole penetrating plate extends through the first passageway.

9. The fluid actuator of claim 7, wherein the conduction unit comprises a second passageway corresponding to the hole penetrating plate, and the hole penetrating plate extends through the second passageway and is fixed to the first actuating area of the actuating portion.

* * * * *